INVENTORS H. F. PRIEBE, JR.
A. E. SPENCER, JR.

BY R. B. Ardis

ATTORNEY

April 2, 1957 H. F. PRIEBE, JR., ET AL 2,787,712

TRANSISTOR MULTIVIBRATOR CIRCUITS

Filed Oct. 4, 1954 2 Sheets-Sheet 2

INVENTORS H. F. PRIEBE, JR.
A. E. SPENCER, JR.

BY R. B. Ardis

ATTORNEY

United States Patent Office 2,787,712
Patented Apr. 2, 1957

1 2

2,787,712

TRANSISTOR MULTIVIBRATOR CIRCUITS

Henry F. Priebe, Jr., Morristown, and Albert E. Spencer, Jr., New Providence, N. J., assignors to Bell Telephone Laboratories, Incorporated, New York, N. Y., a corporation of New York Application October 4, 1954, Serial No. 459,904

12 Claims. (Cl. 250—36)

This invention relates generally to multistate circuits and more particularly, although in its broader aspects not exclusively, to relaxation-type circuits employing transsistors.

A principal object of the invention is to improve the output wave-shape of a transistor multivibrator or binary counter.

Another and more particular object is to reduce the rise times of the output voltage pulses produced by a transistor multivibrator or binary counter.

Still another object is to free the rise time of the output voltage wave-form produced by a transistor multivibrator or binary counter from dependence on circuit, as opposed to transistor, parameters.

A further object is to reduce the D.-C. power requirements of a transistor binary counter for producing an output pulse amplitude which is large in comparison with the supply voltage.

A useful type of transistor multivibrator or binary counter circuit takes the form of a pair of transistors of like conductivity type, a source of D.-C. power poled in the direction of reverse collector current flow in both transistors (i. e., poled so that current flows into the collector and out of the emitter in an n-p-n transistor or out of the collector and into the emitter in a p-n-p transistor) and connected between the respective collector and emitter electrodes of both transistors, a pair of resistances connected one in series between the collector electrode of each transistor and the corresponding side of the D.-C. power source, and means including respective cross-coupling capacitors and resistors connected in parallel between the collector electrode of each transistor and the base electrode of the opposite transistor to bias the transistors to respectively opposite conducting conditions. In the past, however, such a circuit has generally been limited in the rise time of its collector voltage wave-forms (i. e., those intervals in which collector current is being turned "off") by circuit rather than transistor parameters, with the result that the rise time of each output pulse has tended to be a substantial fraction of the pulse length. The cross-coupling capacitors in particular have tended to prevent the collector voltage wave-forms from rising sharply by limiting collector voltage changes to the rate at which the cross-coupling capacitors are being charged.

In a principal aspect, the present invention takes the form of a transistor multivibrator or binary counter of the type described in which the collector voltage wave-forms are permitted to rise sharply, at a rate limited only by transistor characteristics, to at least a substantial fraction of their maximum value. In accordance with this aspect of the invention, a pair of resistances, at least as large as the respective resistances between the collector electrodes and the D.-C. power source, are connected one in series between each transistor collector electrode and the respective cross-coupling capacitor to isolate the transistor from the capacitor while the transistor is in its non-conducting state. Each output collector voltage pulse is thereby enabled to rise sharply to at least a substantial fraction of its maximum value, at a rate determined by transistor, rather than circuit, parameters.

In another and more specific aspect, the invention takes the form of a transistor multivibrator or binary counter of the type described in which the collector voltage wave-forms are permitted to rise sharply substantially all the way to their maximum value upon initiation of each output pulse. In accordance with this aspect of the invention, a pair of asymmetrically conducting devices are poled in the direction of reverse collector current flow in each transistor and connected one in series between each transistor collector electrode and the associated cross-coupling capacitor-resistor combination, and a pair of resistances are connected one from the junction of each asymmetrically conducting device and cross-coupling capacitor and resistor to the transistor collector electrode side of the D.-C. power source. The asymmetrically conducting devices, which may, for example, take the form of semiconductor diodes, have resistances in the reverse conducting direction which are very large in comparison with the resistances between the D.-C. source and the respective transistor collector electrodes and have resistances in the forward conducting direction which approach short-circuits. Each transistor is thereby isolated from the respective cross-coupling capacitor connected to its collector electrode during transition intervals between its "on" and "off" current states, and output collector voltage pulses are permitted to rise sharply substantially all the way to their maximum values at a rate determined by transistor, rather than circuit, parameters. Output voltage wave-shapes are thereby freed from any dependence upon the cross-coupling capacitor charging times.

The present invention also permits a sharp decrease in the amount of D.-C. power required to provide large output pulse amplitudes in a transistor binary counter circuit of the type described. In such a circuit, the base electrode of each transistor is returned through a respective resistance to the side of the D.-C. source coupled to the transistor emitter electrodes. In the prior art circuits, power consumption was determined, at least to a first approximation, by the size of the resistors connected in series between each transistor collector electrode and the D.-C. source. For large collector voltage output pulse amplitudes, it was desirable to make these resistors small, but this in turn tended to increase power consumption. In a number of those embodiments of the present invention using asymmetrically conducting devices to improve the collector voltage wave-shapes, however, this collector resistor as well as the transistor itself is isolated from the power determining path during "on" to "off" transition intervals. Power consumption is controlled by the resistors connected from the respective junctions between each asymmetrically conducting device and the cross-coupling capacitor-resistor combination to the D.-C. source rather than by the external transistor collector resistors. The latter resistors then may be made relatively small, permitting increased collector voltage amplitudes without causing any increase in circuit power consumption.

A more complete understanding of the invention may be obtained from a study of the following detailed description of a typical prior art circuit and several specific embodiments of the invention. In the drawings.

Figure 7:
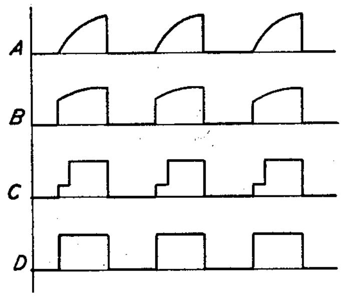
Figure 8:
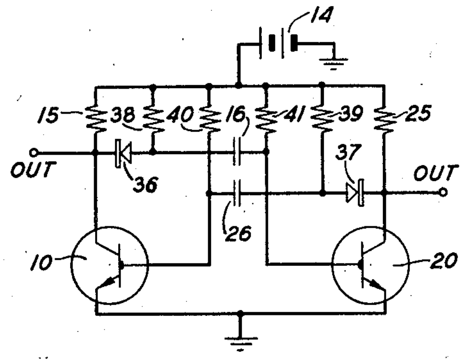
Figure 9:
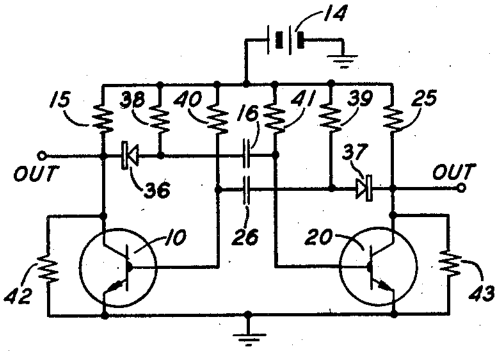

Fig. 7 illustrates output voltage wave-forms produced by the binary counter circuits of Figs. 1 and 3 through 6; and Figs. 8 and 9 illustrate free-running transistor multivibrator circuits embodying the invention.

A binary counter is a bistable device which is capable of being driven from one stable state to the other. Two like triggering pulses are required to produce one complete output pulse. Such counters are used extensively in electronic switching and computing systems and are particularly well suited for the employment of transistors.

Figure 1:
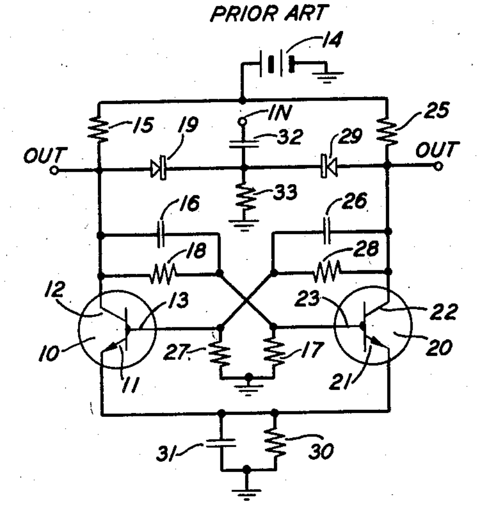
FIG. 1 PRIOR ART
Fig. 1 illustrates a typical transistor binary counter circuit of the type found in the prior art.

A common transistor binary counter found in the prior art is illustrated in Fig. 1. The circuit shown includes a first transistor 10 having an emitter electrode 11, a collector electrode 12, and a base electrode 13 and a second transistor 20 having an emitter electrode 21, a collector electrode 22, and a base electrode 23. In the conventional transistor symbols used, the arrow on each emitter electrode points away from the base, indicating forward emitter current flow out of and reverse collector current flow into the transistor. This is the situation obtaining in junction transistors of the n-p-n type. Neither the present circuit, however, nor the ones which follow are limited to this particular type of transistor. For transistors such as junction transistors of the p-n-p type, which have forward emitter and reverse collector current flow in the opposite direction from those stated above, the circuits are the same as those shown except that the polarities of all diodes and D.-C. supply sources are reversed from those shown.

In the prior art binary counter circuit shown in Fig. 1, D.-C. power is supplied by a suitable source 14. As illustrated, the negative terminal of D.-C. source 14 is grounded, while the positive terminal is connected through a resistance 15 to collector electrode 12 of transistor 10. The positive side of source 14 is connected in a similar manner through a resistance 25 to collector electrode 22 of transistor 20. Depending upon the biasing voltages existing between their base and emitter electrodes, transistors 10 and 20 have two stable states. Each transistor may be either in a substantially conducting state, at which time it presents a low impedance approaching a short-circuit between its emitter and collector electrodes, or in a substantially non-conducting state, at which time it presents an impedance approaching an open-circuit between its emitter and collector electrodes. In order that each transistor may tend to switch the other and hold it in the opposite state, cross-coupling connections are provided between the collector electrode of each transistor and the base electrode of the other. In the binary counter circuit shown in Fig. 1, these cross-coupling connections include a capacitor 16 connected between collector electrode 12 of transistor 10 and base electrode 23 of transistor 20 and a similar capacitor 26 connected between the collector electrode 22 of transistor 20 and the base electrode 13 of transistor 10. A pair of resistors 18 and 28 are connected in parallel with coupling capacitors 16 and 26, respectively, to provide D.-C. coupling to the respective transistor base electrodes. To complete the D.-C. biasing circuit, base electrode 23 of transistor 20 is returned to ground through a resistance 17, and base electrode 13 of transistor 10 is returned to ground through a resistance 27.

The emitter electrodes of transistors 10 and 20 are connected directly together and are returned to ground through an emitter biasing resistor 30 and a bypass capacitor 31. In order to provide two separate outputs, output terminals are connected to collector electrodes 12 and 22, respectively. The signal or triggering pulse input terminal is connected to collector electrodes 12 and 22 through a coupling capacitor 32 and a pair of semiconductor trigger-pulse steering diodes 19 and 29. Pulse routing diodes 19 and 29 are each poled oppositely to the direction of reverse collector current flow in transistors 10 and 20 and are connected from coupling capacitor 32 to collector electrodes 12 and 22, respectively. In the arrangement illustrated in Fig. 1, a resistor 33 is returned to ground from the junction of routing or steering diodes 19 and 29 and capacitor 32.

In the prior art transistor binary counter illustrated in Fig. 1, collector triggering is used because it is much less critical of diode and trigger-pulse characteristics than base triggering. Cross-coupling capacitors 16 and 26 constitute the memory elements of the binary counter which are necessary to prevent the binary counter from firing more than once per triggering pulse. These capacitors also serve to transmit the full trigger-pulse amplitude directly to the base electrode of the "on" transistor.

In operation, each transistor of the binary counter circuit of Fig. 1 tends to switch to and remain in its conducting or "on" condition while the other transistor is in its non-conducting or "off" condition and vice versa. A negative triggering pulse at the input terminal reverses whatever set of conditions exists at the time of its arrival. A second negative triggering pulse reverses conditions once more and restores them to the state that existed prior to the arrival of the first pulse. The output voltage waveform taken at the collector electrode of either transistor is at its minimum value (determined by the voltage across biasing resistor 30 and the internal emitter-collector resistance of the transistor) while the transistor is in its "on" condition. When the transistor switches to its "off" condition, this voltage rises to its maximum value (determined by resistors 15, 17, and 18 or by resistors 25, 27, and 28).

Figure 2:
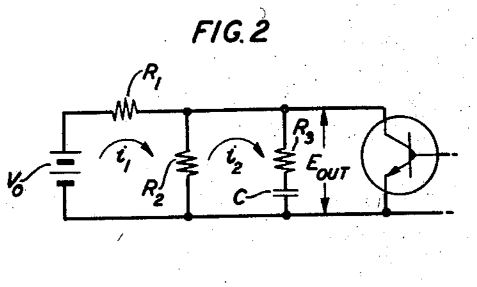
Fig. 2 is an equivalent circuit of a portion of the binary counter illustrated in Fig. 1.

An equivalent circuit for the output portion of the counter is shown in Fig. 2, where $V_0$ is the difference between the voltage supplied by D.-C. source 14 and the bias voltage at the transistor emitter electrode provided by resistor 30, $R_1$ is the resistance of either resistor 15 or resistor 25, $R_2$ is the resistance of either resistor 18 or resistor 28, $R_3$ is a resistance which will be discussed later and which is zero in the prior art circuit shown in Fig. 1, and C is the capacity of either capacitor 16 or capacitor 26. The rise time of the output wave-form of the circuit shown in Fig. 1 may be calculated with the aid of the equivalent circuit shown in Fig. 2.

In Fig. 2, prior to time $t=0$, the transistor acts as a closed switch. At $t=0$, the switch opens, and the equations which define this situation are $$V_0=(R_1+R_2)i_1-R_2i_2 \qquad (1)$$

$$0=-R_2i_1+(R_2+R_3)i_2+\frac{1}{C}\int i_2dt \qquad (2)$$

where $i_1$ is the current flowing in the indicated direction around the loop including $V_0$, $R_1$, and $R_2$, and $i_2$ is the current flowing in the indicated direction around the loop formed by $R_2$, $R_3$, and C.

Solution of these equations yields $$i_1=\frac{V_0}{R_1+R_2}+\frac{V_0R_2^2}{R_1R_2(R_1+R_2)+R_3(R_1+R_2)^2}\epsilon^{-\lambda t} \qquad (3)$$

$$i_2=\frac{V_0R_2}{R_1R_2+R_3(R_1+R_2)}\epsilon^{-\lambda t} \qquad (4)$$

where $$\lambda=\frac{R_1+R_2}{C[R_iR_2+R_3(R_1+R_2)]} \qquad (5)$$

The output voltage $E_{out}$ is the voltage between the emitter and collector electrodes of the transistor and, as determined from Equation 4, is $$E_{out}=i_2R_3+\frac{1}{C}\int i_2dt \qquad (6)$$

or $$E_{out}=\frac{V_0R_2}{R_1+R_2}\left(1-\frac{R_1R_2}{R_1R_2+R_3(R_1+R_2)}\epsilon^{-\lambda t}\right) \qquad (7)$$

Since, as explained above, $R_3=0$ in the circuit of Fig. 1, the expression for $E_{out}$ in Equation 7 reduces to $$E_{out}=\frac{V_0R_2}{R_1+R_2}\left(1-\epsilon^{-\frac{R_1+R_2}{R_1R_2C}t}\right) \qquad (8)$$

If rise time $t_r$ is defined as the time required for the output voltage to rise to 90 percent of its final value, an expression for $t_r$ may be derived from Equation 8 as follows:

$$.9=\left(1-\epsilon^{-\frac{R_1+R_2}{R_1R_2C}t_r}\right) \quad (9)$$

$$t_r=\frac{2.3R_1R_2C}{R_1+R_2} \quad (10)$$

Typical values for the equivalent circuit shown in Fig. 2 are:

$R_1=16{,}000$ ohms
$R_2=30{,}000$ ohms
$C=500$ micromicrofarads

Using these values in Equation 10, $t_r$ is found to be equal to 12 microseconds.

The output voltage rise time for the prior art binary counter circuit in Fig. 1 is thus very appreciable when compared to the repetition rate at which the circuit may be operated. In extreme form, the output voltage waveshape is that shown in line A of Fig. 7. The output pulses are not square at all but are more nearly triangular.

In the example given in connection with Fig. 2, the practical minimum value of C is limited by transistor and stray capacities to that given. However, any value of C, no matter how small, affects the output wave-form. The present invention permits the triggering and memory features of the prior art cross-coupling arrangement shown in Fig. 1 to be retained but substantially eliminates the adverse effect of the cross-coupling condenser on the rise time of the output wave-form.

Figure 3:
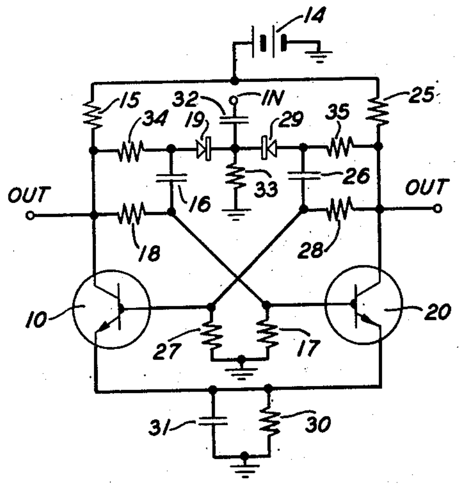
Figs. 3 through 6 illustrate transistor binary counter circuits embodying various features of the present invention.

One embodiment of the present invention is illustrated in Fig. 3. The transistor binary counter shown there is the same as the prior art circuit illustrated in Fig. 1 except for the addition of two resistors 34 and 35. These resistors, which are each at least as large as their associated transistor collector resistors 15 and 25, are used to isolate the cross-coupling capacitors 16 and 26 from the collector electrodes of transistors 10 and 20, respectively. Resistor 34 is connected in series between the collector electrode of transistor 10 and capacitor 16 with pulse-steering diode 19 connected to the junction between resistor 34 and capacitor 16. Resistor 35 is similarly connected between the collector electrode of transistor 20 and capacitor 26, and steering diode 29 is connected between resistor 35 and capacitor 26.

Resistance $R_3$ in the equivalent circuit shown in Fig. 2 is either resistor 34 or resistor 35 of the embodiment of the invention shown in Fig. 3. The output voltage wave-form for the binary counter shown in Fig. 3 is illustrated in line B of Fig. 7. As illustrated in Fig. 7, the output wave-form takes an initial step, the rise time of which is determined by transistor, rather than circuit, characteristics. From this point, the rate of rise is slower than in Fig. 1, but if the initial step is large enough, the slower rise time is relatively unimportant. If resistors 34 and 35 could be made large enough, the effect of cross-coupling capacitors 16 and 26 on the rise time would be negligible, but there is an upper limit on the sizes of resistors 34 and 35. This is determined by the potentials at the junction of resistor 34, capacitor 16, and diode 19 and at the junction of resistor 35, capacitor 26, and diode 29. Each of these potentials should be low when the corresponding transistor is "on" or proper triggering will not occur.

For the embodiment of the invention illustrated in Fig. 3, the total rise time may be found from Equation 7:

$$.9=\left(1-\frac{R_1R_2}{R_1R_2+R_3(R_1+R_2)}\epsilon^{-\lambda t_r}\right) \quad (11)$$

Assuming $R_3$ equal to 20,000 ohms, $$t_r=\frac{1.233}{\lambda}=\frac{1.233\times C[R_1R_2+2\times 10^4(R_1+R_2)]}{R_1+R_2} \quad (12)$$

Using the values for $R_1$, $R_2$, and C given in connection with Fig. 1, this rise time is found to equal to 18.8 microseconds. This is a longer rise time than that provided by the prior art circuit of Fig. 1. However, at $t=0$, a finite output voltage exists. This voltage is $$E_{out}=\frac{V_0R_2}{R_1+R_2}\left(1-\frac{R_1R_2}{R_1R_2+R_3(R_1+R_2)}\right) \quad (13)$$

which, for the values given, is 65.7 percent of the ultimate maximum voltage.

Figure 4:
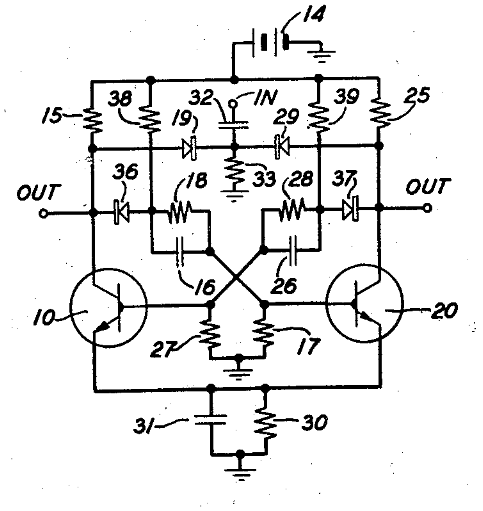

Fig. 4 illustrates a transistor binary counter embodying the invention in which the rise times of the output voltages at the collector electrodes are substantially completely freed from dependence upon cross-coupling capacitors 16 and 26. The circuit is substantially the same as the prior art circuit shown in Fig. 1, with the exception that a pair of semiconductor diodes 36 and 37 and a pair of resistors 38 and 39 are provided to isolate the cross-coupling capacitors from the associated transistor collector electrodes during charging intervals. Diode 36 is poled in the direction of reverse collector current flow in transistor 10 and is connected in series between the collector electrode of transistor 10 and capacitor 16. Resistor 38 is connected to the positive side of D.-C. supply source 14 from the junction of capacitor 16, resistor 18, and diode 36 in order to provide a charging path for capacitor 16. Diode 37 and resistor 39 are connected in a similar manner. Diode 37 is poled in the direction of reverse collector current flow in transistor 20 and is connected in series between the collector electrode of transistor 20 and capacitor 26. Resistor 39 is returned to the positive side of source 14 from the junction of capacitor 26, resistor 28, and diode 37.

In the embodiment of the invention shown in Fig. 4, the additional diodes 36 and 37 connected between the respective collector electrodes of the transistors and the cross-coupling memory condensers 16 and 26 remove the condensers from the respective output circuits during the collector voltage rise times. Briefly, the operation is as follows. For convenience, it is assumed that the left-hand transistor 10 is "on" (i. e., the voltages at its base, collector, and emitter electrodes are substantially equal), and the right-hand transistor 20 is "off" (i. e., the voltage at the base is below the voltage at the emitter). It is desired to change the state of the binary counter, and a negative trigger pulse is applied to the input terminal. The two diodes 29 and 37 on the right are forward-biased by the trigger, and the negative pulse appears at the base of the "on" transistor 10. The left-hand transistor 10 is thus turned "off" (i. e., the voltage at the base is made less than the voltage at the emitter). The voltage at the collector electrode of transistor 10 then rises, immediately reverse-biasing the diode 36 connected between its collector electrode and the memory condenser 16. Condenser 16 charges through the additional path provided by resistor 38 and has no effect on the output wave-form. The output wave-form provided by the embodiment of the invention shown in Fig. 4 is that illustrated in line C of Fig. 7. However, as shown in line C of Fig. 7, the trigger pulse appears in the output wave-form and limits the rise time in addition to delaying the rising edge of the wave-form by the width of the trigger pulse.

Figure 5:
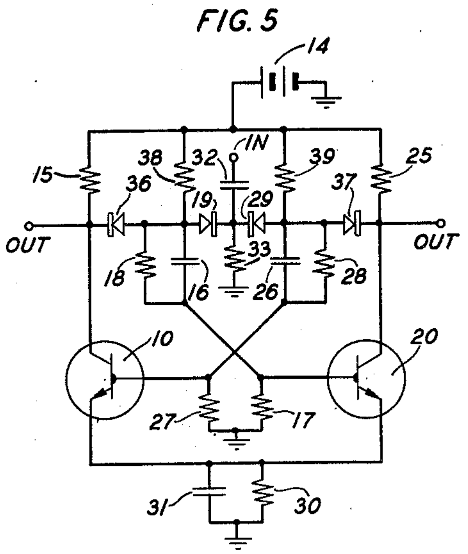

Fig. 5 illustrates a transistor binary counter embodying the invention which is arranged to remove the triggering pulse from the output and also to reduce the trigger pulse requirement. The trigger has only to drain current from the base-biasing divider instead of both the base-biasing divider and the collector output circuit, as in the previous examples. The embodiment of the invention shown in Fig. 5 is the same as that described in connection with Fig. 4 except that instead of being connected to the collector electrodes of transistors 10 and 20, pulse-steering diodes 19 and 29 are connected, respectively, to the junction of capacitor 16 and diode 36 and the junction of capacitor 26 and diode 37.

For the embodiment of the invention illustrated in Fig. 5, the resistance $R_3$ in the equivalent circuit of Fig. 2 is the back-resistance of either diode 36 or diode 37. It $R_3$ is one megohm (a typical value for a semiconductor diode), it can be shown from Equation 13 that the voltage takes an initial step to 99 percent of its final value. In other words, the rise time of the output collector voltage wave-form is limited only by transistor characteristics, not by circuit characteristics. Line D of Fig. 7 illustrates the output wave-form for the embodiment of the invention shown in Fig. 5. The output wave-form rise time may be less than 1.0 microsecond.

The transistor binary counters shown in Figs. 4 and 5 may, in accordance with a feature of the invention, be arranged to give high output voltages with a much lower power drain on D.-C. source 14 than is possible with conventional circuits. In the prior art circuit shown in Fig. 1, the power drain on source 14 is determined, at least to a rough first approximation, by the current drain by the paths formed by resistors 15 and 25 and the voltage dividers made up of resistors 18 and 28 and resistors 17 and 27. The maximum collector voltage obtainable from the prior art circuit, however, is dependent upon the size of collector resistors 15 and 25. If these resistors are relatively small with respect to the "off" emitter-collector resistances of transistors 10 and 20, the output collector voltages will be relatively large percentages of the D.-C. voltage supplied by source 14. However, reducing the sizes of resistors 15 and 25 to increase output voltage has the effect of reducing the resistance in the principal paths drawing current from source 14. The present invention makes it possible to increase the output voltages available at the transistor collector electrodes without increasing the power drain from source 14.

In the embodiments of the invention illustrated in Figs. 4 and 5, diodes 36 and 37 serve not only to isolate memory capacitors 16 and 26 from the collector electrodes of transistors 10 and 20 during charging intervals but also to isolate the main current drain paths from the collector resistors 15 and 25. In Figs. 4 and 5, the current drawn from source 14 is governed by resistors 38 and 39 rather than by resistors 15 and 25, since the latter resistors are isolated from the cross-coupling paths by diodes 36 and 37. Resistors 15 and 25 can therefore be made small relative to the "off" internal emitter-collector resistances of transistors 10 and 20. The output pulse height available at the transistor collector electrodes can therefore be increased over that available from the prior art circuit without increasing the power drain from source 14.

Figure 6:
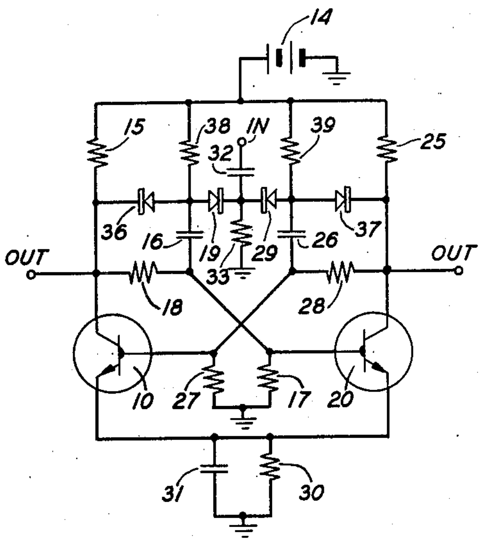

While the embodiments of the invention illustrated in Figs. 4 and 5 do not have an output pulse height which is stable for variations in $I_{co}$ (the transistor collector current which flows for zero emitter current), they may, as pointed out above, be arranged to give a high output voltage at a much lower power consumption than conventional circuits. However, they may be rearranged, if desired, to provide stability against $I_{co}$ variations (at the expense of the above-described D.-C. power economy). Fig. 6 illustrates a transistor binary counter embodying the invention in which the output voltage is stabilized against $I_{co}$ variations. It is the same as the circuit shown in Fig. 5, except that resistors 18 and 28, instead of being connected from their respective transistor base electrodes to the respective junctions between diodes 36 and 19 and diodes 29 and 37, are returned to the respective collector electrodes of transistors 10 and 20. The output wave-form for the embodiment of the invention shown in Fig. 6 is also that shown in line D of Fig. 7.

While the invention has been described primarily with reference to bistable transistor circuits suitable for use as binary counters, it should be understood that it is also applicable to free-running transistor multivibrators. One transistor multivibrator embodying the invention is shown in Fig. 8. The circuit in Fig. 8 is generally similar to the embodiments of the invention which have already been described but differs in some respects in order to provide free-running characteristics. The circuit in Fig. 8 includes a pair of transistors 10 and 20, a D.-C. supply source 14, and a pair of resistors 15 and 25, respectively, connecting the collector electrodes of transistors 10 and 20 to the positive side of source 14. The negative side of source 14 is grounded. The emitter electrodes of transistors 10 and 20 are both grounded, and the base electrodes are connected through a pair of resistors 40 and 41, respectively, to the positive side of source 14. A semiconductor diode 36 and a cross-coupling capacitor 16 are connected in series between the collector electrode of transistor 10 and the base electrode of transistor 20, and a second similar semiconductor diode 37 and cross-coupling capacitor 26 are connected in series between the collector electrode of transistor 20 and the base electrode of transistor 10. Diodes 36 and 37 are both poled in the direction of reverse collector current flow in their respective transistors 10 and 20. A resistor 38 is returned to the positive side of source 14 from the junction between diode 36 and capacitor 16, and a second similar resistor 39 is returned to the positive side of source 14 from the junction between diode 37 and capacitor 26. Respective output terminals are connected to the collector electrodes of transistors 10 and 20.

With the exception that it is free-running, the embodiment of the invention illustrated in Fig. 8 operates in substantially the same manner as those which have already been described. Diodes 36 and 37 serve to isolate the respective cross-coupling capacitors from the transistor collector electrodes during charging intervals and to make the collector voltage rise times independent of circuit parameters.

A free-running transistor multivibrator embodying the invention in which the output pulse amplitude is stabilized against $I_{co}$ variations is shown in Fig. 9. The circuit in Fig. 9 is the same as that in Fig. 8 except that a pair of resistors 42 and 43, of the order of magnitude of resistors 15 and 25, are connected between the emitter and collector electrodes of transistors 10 and 20, respectively. The circuit shown in Fig. 9 operates in substantially the same manner as that shown in Fig. 8.

It is to be understood that the arrangements which have been described are illustrative of the application of the principles of the invention. Numerous other arrangements may be devised by those skilled in the art without departing from the spirit and scope of the invention.

What is claimed is:

1. A multistate circuit which comprises a pair of transistors of like conductivity type each having a substantially conducting state and a substantially non-conducting state, each of said transistors having an emitter electrode, a collector electrode, and a base electrode, a source of direct potential connected between the emitter and collector electrodes of said transistors and poled in the direction of reverse collector current flow in said transistors, a pair of first resistances one connected in series between the collector electrode of each of said transistors and the side of said source associated therewith, means including respective cross-coupling capacitors connected from the collector electrode of each one of said transistors to the base electrode of the other to bias it to the respectively opposite state, and means including respective second resistances at least as large as said first resistances connected in series between the collector electrode of each one of said transistors and the respective cross-coupling capacitor to isolate said cross-coupling capacitor from said transistor and prevent said cross-coupling capacitor from limiting the initial rise time of the voltage at said collector electrode.

2. A multistate circuit which comprises a pair of transistors of like conductivity type each having a substantially conducting state and a substantially non-conducting state, each of said transistors having an emitter electrode, a collector electrode, and a base electrode, a source of direct potential connected between the emitter and collector electrodes of said transistors and poled in the direction of reverse collector current flow in said transistors, a pair of first resistances one connected in series between the collector electrode of each of said transistors and the side of said source associated therewith, means including respective cross-coupling capacitors connected from the collector electrode of each one of said transistors to the base electrode of the other to bias it to the respectively opposite state, and means including respective semiconductor diodes poled in the direction of reverse collector current flow in the associated transistors connected in series between the collector electrode of each one of said transistors and the respective cross-coupling capacitor, and respective second resistances connected from the junction between each one of said diodes and the associated cross-coupling capacitor to the side of said source associated with said collector electrodes to isolate said cross-coupling capacitor from said transistor while said transistor is in its non-conducting state and prevent said cross-coupling capacitor from limiting the initial rise time of the voltage at said collector electrode.

3. A binary counter which comprises a pair of transistors of like conductivity type each having a substantially conducting state and a substantially non-conducting state, each of said transistors having an emitter electrode, a collector electrode, and a base electrode, a source of direct potential connected between the emitter and collector electrodes of said transistors and poled in the direction of reverse collector current flow in said transistors, a pair of first resistances one connected in series between the collector electrode of each of said transistors and the side of said source associated therewith, means including respective cross-coupling capacitors connected from the collector electrode of each one of said transistors to the base electrode of the other, and respective second resistances connected from the base electrode of one of said transistors to the side of said source associated with said emitter electrodes to bias the other transistor to the respective opposite state, means including respective first semiconductor diodes poled in the direction of reverse collector current flow in the associated transistors connected in series between the collector electrode of each one of said transistors and the respective cross-coupling capacitor, and respective third resistances connected from the junction between each one of said diodes and the associated cross-coupling capacitor to the side of said source associated with said collector electrodes to isolate the cross-coupling capacitor from said transistor while said transistor is in its non-conducting state and prevent said cross-coupling capacitor from limiting the initial rise time of the voltage at said collector electrode, at least one signal output terminal connected to the collector electrode of one of said transistors, a signal input terminal, and a pair of second semiconductor diodes oppositely poled with respect to said first diodes connected from said input terminal to respective ones of the junctions between said first diodes and said cross-coupling capacitors, whereby a first pulse at said input terminal triggers one of said transistors to its conducting state and the other of said transistors to its non-conducting state, and a second succeeding pulse at said input terminal triggers said transistors to their respectively opposite conducting states.

4. A binary counter in accordance with claim 3 which includes respective fourth resistances connected between the collector electrodes of each one of said transistors and the base electrodes of the other transistors to provide stabilization of the magnitude of the voltage at said output terminal against variations in $I_{co}$, where $I_{co}$ is the collector current which flows in each transistor in the absence of emitter current.

5. A free-running multivibrator which comprises a pair of transistors of like conductivity type each having a substantially conducting state and a substantially non-conducting state, each of said transistors having an emitter electrode, a collector electrode, and a base electrode, a source of direct potential connected between the emitter and collector electrodes of said transistors and poled in the direction of reverse collector current flow in said transistors, a pair of first resistances one connected in series between the collector electrode of each of said transistors and the side of said source associated therewith, means including respective cross-coupling capacitors connected from the collector electrode of each one of said transistors to the base electrode of the other, and respective second resistances connected from the base electrode of each one of said transistors to the side of said source associated with said collector electrodes to bias the other transistor to the respectively opposite state, means including respective first semiconductor diodes poled in the direction of reverse collector current flow in the associated transistors connected in series between the collector electrode of each one of said transistors and the respective cross-coupling capacitor and respective third resistances connected from the junction between each one of said diodes and the associated cross-coupling capacitor to the side of said source associated with said collector electrodes to isolate the cross-coupling capacitor from said transistor while said transistor is in its non-conducting state and prevent said cross-coupling capacitor from limiting the initial rise time of the voltage at said collector electrode, and at least one signal output terminal connected to the collector electrode of one of said transistors.

6. A free-running multivibrator in accordance with claim 5 which includes respective fourth resistances connected between the collector and emitter electrodes of each of said transistors to provide stabilization of the magnitude of the voltage at said output terminal against variations in $I_{co}$, where $I_{co}$ is the collector current which flows in each transistor in the absence of emitter current.

7. A multistate circuit which comprises a pair of transistors of like conductivity type each having a substantially conducting state and a substantially non-conducting state, each of said transistors having an emitter electrode, a collector electrode, and a base electrode, means including cross-coupling capacitors connected from the collector electrode of each one of said transistors to the base electrode of the other to bias it to the respectively opposite state, and means including respective semiconductor diodes poled in the direction of reverse collector current flow connected in series between the collector electrode of each one of said transistors and the respective cross-coupling capacitor to isolate said cross-coupling capacitor from said transistor while said transistor is in its non-conducting state and prevent said cross-coupling capacitor from limiting the initial rise time of the voltage at said collector electrode.

8. A multistate circuit which comprises a pair of transistors each having a substantially conducting state and a substantially non-conducting state, means including respective cross-coupling capacitors connected from each one of said transistors to the other to bias it to the respectively opposite state, and means including respective semiconductor diodes connected in series between each one of said transistors and the respective cross-coupling capacitor to isolate said cross-coupling capacitor from said transistor while said transistor is in its non-conducting state.

9. A multistate circuit which comprises a pair of amplifying devices each having a substantially conducting state and a substantially non-conducting state, each of said amplifying devices having a current-emissive electrode, a current-receiving electrode, and a control electrode for current passing between said current-emissive and current-receiving electrodes, a source of direct potential connected between the current-emissive and current-receiving electrodes of said amplifying devices and poled in the direction of reverse current flow in the current-receiving electrodes of said amplifying devices, a pair of first resistances one connected in series between the current-receiving electrode of each of said amplifying devices and the side of said source associated therewith, means including respective cross-coupling capacitors connected from the current-receiving electrode of each one of said amplifying devices to the control electrode of the other to bias it to the respectively opposite state, and means including respective second resistances at least as large as said first resistances connected in series between the current-receiving electrode of each one of said amplifying devices and the respective cross-coupling capacitor to isolate said cross-coupling capacitor from said amplifying device and prevent said cross-coupling capacitor from limiting the initial rise time of the voltage at said current-receiving electrode.

10. A multistate circuit which comprises a pair of amplifying devices each having a substantially conducting state and a substantially non-conducting state, each of said amplifying devices having a current-emissive electrode, a current-receiving electrode, and a control electrode for current passing between said current-emissive and current-receiving electrodes, a source of direct potential connected between the current-emissive and current-receiving electrodes of said amplifying devices and poled in the direction of reverse current flow in the current-receiving electrodes of said amplifying devices, a pair of first resistances one connected in series between the current-receiving electrode of each of said amplifying devices and the side of said source associated therewith, means including respective cross-coupling capacitors connected from the current-receiving electrode of each one of said amplifying devices to the control electrode of the other to bias it to the respectively opposite state, and means including respective asymmetrically conducting devices poled in the direction of reverse current flow in the current-receiving electrode of the associated amplifying device connected in series between the current-receiving electrode of each one of said amplifying devices and the respective coupling capacitor to isolate said cross-coupling capacitor from said amplifying device while said amplifying device is in its non-conducting state and prevent said cross-coupling capacitor from limiting the initial rise time of the voltage at said current-receiving electrode.

11. A multistate circuit which comprises a pair of amplifying devices each having a substantially conducting state and a substantially non-conducting state, each of said amplifying devices having a current-emissive electrode, a current-receiving electrode, and a control electrode for current passing between said current-emissive and current-receiving electrodes, means including respective cross-coupling capacitors connected from the current-receiving electrode of each one of said amplifying devices to the control electrode of the other to bias it to the respectively opposite state, and means including respective asymmetrically conducting devices poled in the direction of reverse current flow in the current-receiving electrode of the associated amplifying device connected in series between the current-receiving electrode of each one of said amplifying devices and the respective cross-coupling capacitor to isolate said cross-coupling capacitor from said amplifying device while said amplifying device is in its non-conducting state and prevent said cross-coupling capacitor from limiting the initial rise time of the voltage at said current-receiving electrode.

12. A multistate circuit which comprises a pair of amplifying devices each having a substantially conducting state and a substantially non-conducting state, means including respective cross-coupling capacitors connected from each one of said amplifying devices to the other to bias it to the respectively opposite state, and means including respective asymmetrically conducting devices connected in series between each one of said amplifying devices and the respective cross-coupling capacitor to isolate said cross-coupling capacitor from said amplifying device while said amplifying device is in its non-conducting state.

References Cited in the file of this patent

UNITED STATES PATENTS

| | | |
|---|---|---|
| 2,647,999 | Best | Aug. 4, 1953 |
| 2,709,770 | Hansen | May 31, 1955 |